United States Patent

Terletzki

[11] Patent Number: 6,075,383
[45] Date of Patent: Jun. 13, 2000

[54] GTL OUTPUT AMPLIFIER FOR COUPLING AN INPUT SIGNAL PRESENT AT THE INPUT INTO A TRANSMISSION LINE PRESENT AT THE OUTPUT

[75] Inventor: Hartmud Terletzki, München, Germany

[73] Assignee: Siemens Aktiengesellschaft, Munich, Germany

[21] Appl. No.: 08/930,535

[22] PCT Filed: Apr. 19, 1996

[86] PCT No.: PCT/DE96/00693

§ 371 Date: Oct. 27, 1997

§ 102(e) Date: Oct. 27, 1997

[87] PCT Pub. No.: WO96/34458

PCT Pub. Date: Oct. 31, 1996

[30] Foreign Application Priority Data

Apr. 28, 1995 [DE] Germany .......................... 195 15 800

[51] Int. Cl.⁷ .............................................. H03K 19/0185
[52] U.S. Cl. ................................ 326/86; 326/27; 326/83; 326/80; 326/81
[58] Field of Search .................................. 326/21, 30, 62, 326/82, 85, 27, 83, 86, 26, 80, 81, 68; 361/100, 101

[56] References Cited

U.S. PATENT DOCUMENTS

| 4,739,193 | 4/1988 | Doty, II | 307/443 |
| 4,880,997 | 11/1989 | Steele | 307/443 |
| 5,359,243 | 10/1994 | Norman | 307/475 |
| 5,365,127 | 11/1994 | Manley | 326/73 |
| 5,410,189 | 4/1995 | Nguyen | 327/374 |

FOREIGN PATENT DOCUMENTS

| 0 047 128 | 10/1982 | European Pat. Off. . |
| 0 216 178 A1 | 1/1987 | European Pat. Off. . |
| 42 08 729 A1 | 9/1993 | Germany . |
| 2 244 613 | 4/1991 | United Kingdom . |

OTHER PUBLICATIONS

Patent Abstracts of Japan vol. 16, No. 048, (E–1163), Feb. 6, 1992, & JP 03 250813, Hitachi Ltd., Nov. 8, 1991, H. Norikazu, Output Circuit, 1 page.
Patent Abstracts of Japan, vol. 014, No. 489, (E–0994), Oct. 24, 1990 & JP 02 202222, Mitsubishi Electric Corp., Aug. 10, 1990, T. Ichimura, Output Circuit, 1 page.
IEEE International Solid State Circuits Conference, No. 35, Feb. (1992), Gunning et al, A CMOS Low–Voltage–Swing Transmission–Line Transceiver, pp. 58–59.
Patent Abstracts of Japan, vol. 6, No. 115 (E–115) Jun. 26, 1982 & JP 57–045717, Tokyo Shibaura Denki, K.K., Mar. 15, 1982, T. Hzuka, Signal Change Detector, 1 page.
Patent Abstracts of Japan, vol. 95, No. 005, & JP 07–121276, Nippon Telegraph & Telephone, Corp., May 12, 1995, O. Yusuke et al, FET Type Interface Circuit, 1 page.

*Primary Examiner*—Sally C. Medley
*Attorney, Agent, or Firm*—Hill & Simpson

[57] ABSTRACT

In order to be able to couple radio-frequency input signals into a transmission line with the aid of a GTL output amplifier, the GTL output amplifier provides a pull-up transistor circuit (MP1, MN2) in addition to a pull-down stage (MN1). With the aid of the pull-down stage (MN1), the output (A) is put at a first potential in the presence of an input signal (E) of the first value; with the aid of the pull-up transistor circuit (MP1, MN2), the output is put at a second potential during the transition of the input signal from the first to the second value. The pull-up transistor circuit is subsequently switched off and the potential at the output is determined by the potential on the line. When the input signal assumes the first value again, the pull-down stage is switched on again and applies the first potential again to the output.

4 Claims, 4 Drawing Sheets

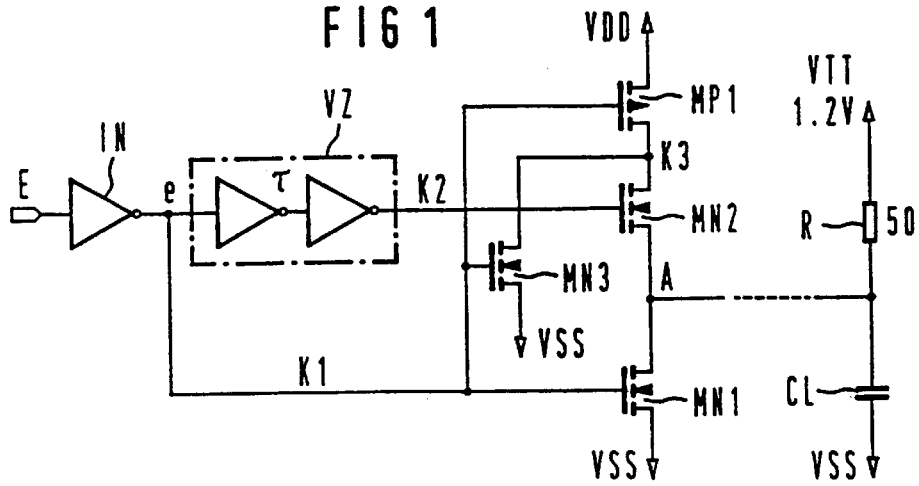
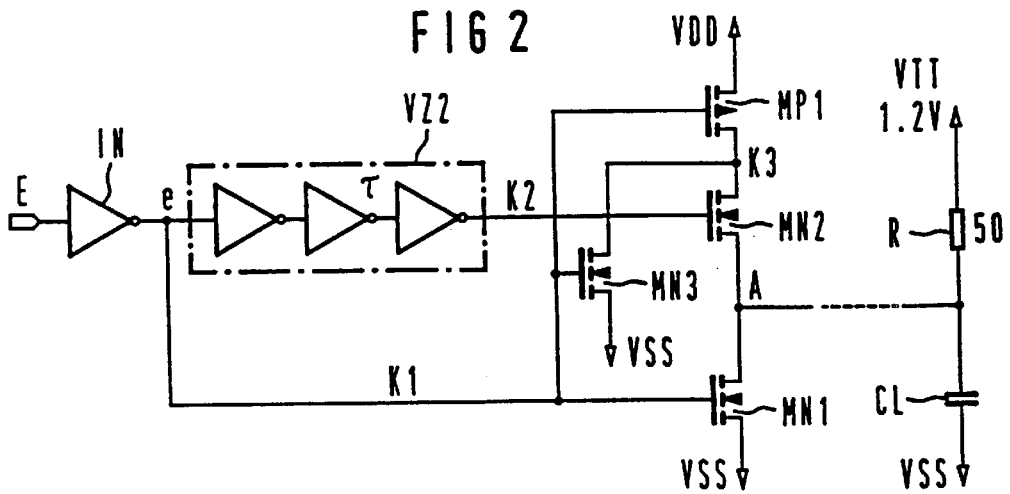

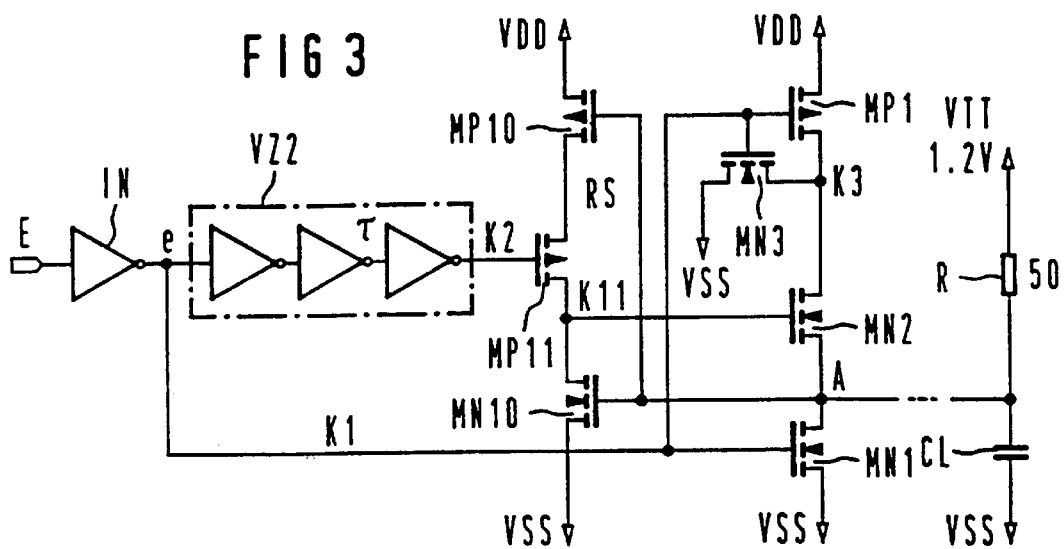
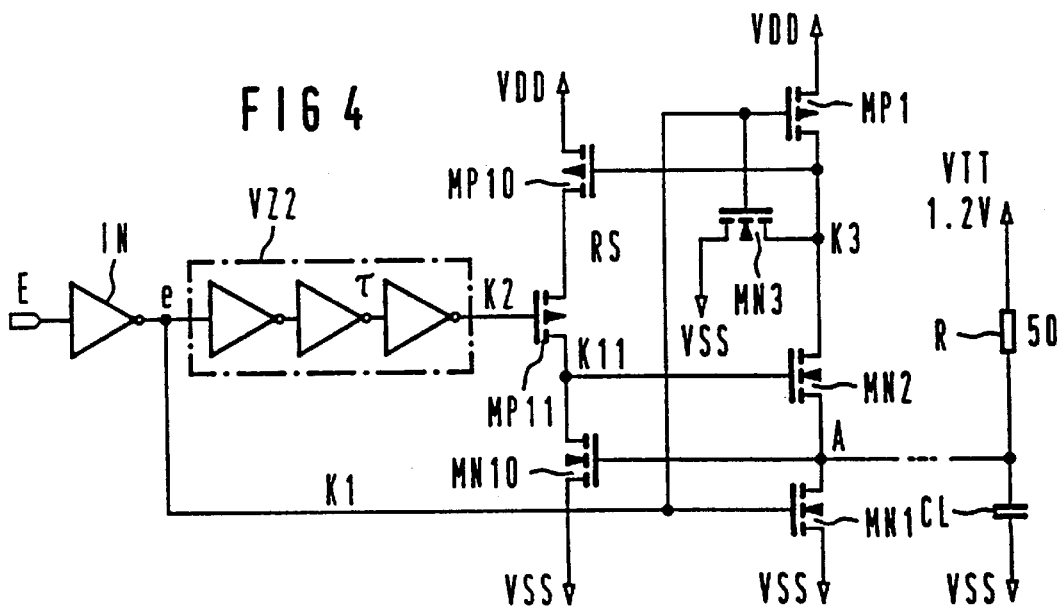

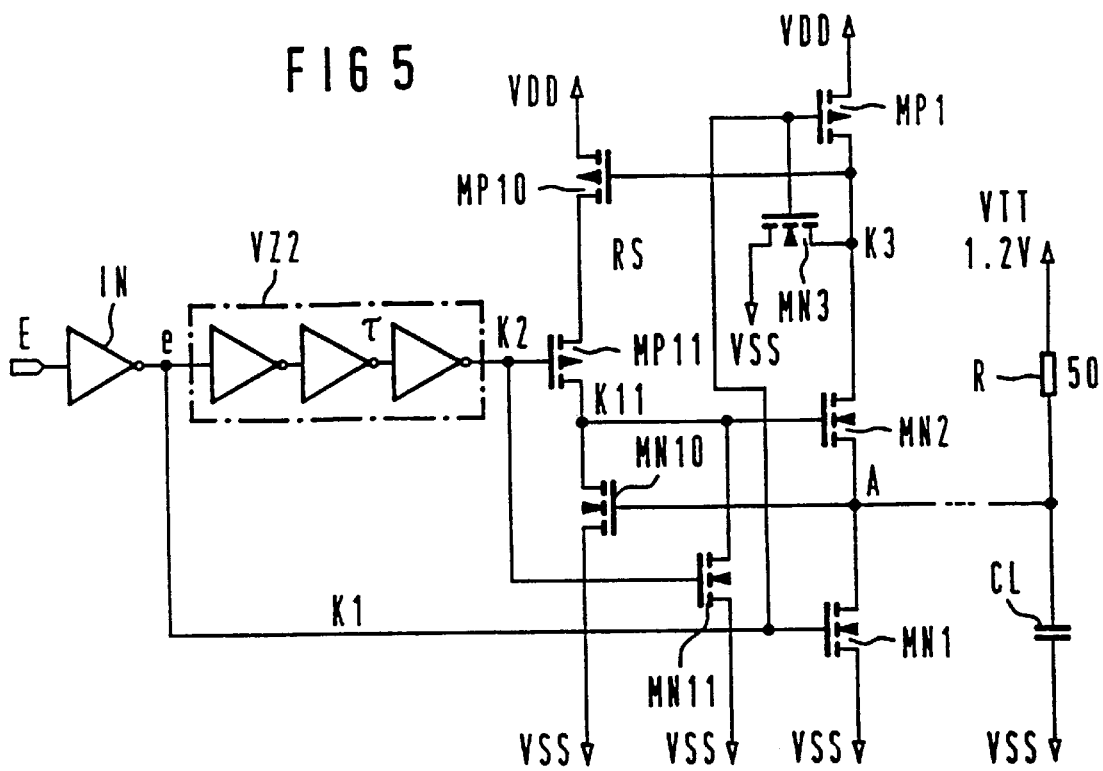

GTL OUTPUT AMPLIFIER FOR COUPLING AN INPUT SIGNAL PRESENT AT THE INPUT INTO A TRANSMISSION LINE PRESENT AT THE OUTPUT

BACKGROUND OF THE INVENTION

Input/output circuits of semiconductor modules or chips are the link between the on-chip and off-chip signal levels or signals. The number of input/output circuits in this case depends on the function of the chip. These days, it is no longer unusual for there to be input/output ports of the order of magnitude of 100 terminals per chip, for example in digital exchanges. Wide bus lines on the printed circuit boards interconnect the individual components of a system. The trend here is toward transmission rates of ever higher frequency via the transmission lines of the bus. On account of interference immunity, the radio-frequency signals are additionally transmitted in a complementary manner, which again doubles the number of input/output ports.

Conventional CMOS output amplifiers (CMOS buffers) are not suitable for radio-frequency applications (>100 to 500 MHz) on account of the poor signal quality (overshoots/undershoots) and the high voltage swing. Radio-frequency signals are usually transmitted using ECL technology with terminated 50 Ω transmission lines. Terminated 50 Ω lines prevent reflection and thus distortion of the signals during transmission via the line. A disadvantage of ECL technology is the relatively high power loss, which, depending on the number of input/output ports, can become the determining factor of the total power loss of a module.

The open-collector technology which is employed in various standards (ECL standard=Emitter Coupled Logic; GTL standard=Gunning Transceiver Logic; CTT standard=Center Tap Terminated Digital Interface) is helpful for reducing the on-chip power loss. In this case, part of the power loss is transferred to an external resistor. However, the disadvantage of open-collector or open-drain technology is the limited suitability for radio frequencies, since the signal rise at the output is limited depending on the external resistor and load capacitance. Although the pull-down transistor of the output amplifier can be dimensioned such that the load capacitance of the line is discharged in an appropriate time, the rise time for the high level is determined by the RC time of the external resistor and load capacitance. If the external resistor is realized as a 50 Ω terminating resistor in order to avoid line reflections, as proposed for example by B. Gunning (B. Gunning, "CMOS Low-Voltage-Swing Transmission-Line Transceiver", ISSCC 92, pages 58 to 59), a load of 2.5 pF suffices to limit the switching frequency to approximately 500 MHz.

The problem on which the invention is based consists in specifying a GTL output amplifier for coupling an input signal present at the input into a transmission line present at the output, by means of which amplifier radio-frequency signals can also be switched on to the transmission line.

SUMMARY OF THE INVENTION

In general terms the present invention is a GTL output amplifier for coupling an input signal present at the input into a transmission line present at the output. A pull-down transistor applies a first potential to the output in the event of a first value of the input signal. A pull-up transistor circuit has a series circuit formed by a first transistor, which is switched off in the presence of the first value of the input signal and switched on in the presence of a second value of the input signal, and by a second transistor, whose input is connected to a delay circuit. The second transistor remains switched on for a time which is governed by the delay circuit, during a transition phase of the input signal from the first value, to the second value. The delay circuit is provided between input signal and the second transistor. The delay circuit switches off the second transistor when the second value of the input signal occurs and after the time governed by the delay circuit has elapsed. A third transistor is connected between the junction point of the two transistors of the series circuit and is switched on in the event of the first value of the input signal. The pull-up transistor circuit is supplemented by a control circuit, which has a first control transistor, a second control transistor and a third control transistor. The pull-up transistor circuit switches the second transistor off when the third control transistor of the control circuit is switched on as soon as the potential of the output exceeds the threshold voltage of the third control transistor.

Advantageous developments of the present invention are as follows.

The control circuit has a series circuit formed by the first control transistor, the second control transistor and the third control transistor. The second control transistor is connected to the output of the delay circuit. The junction point between the second control transistor and the third control transistor is connected to the input of the second transistor of the transistor circuit. The input of the third control transistor is connected to the output. The first control transistor is connected to the junction point between the first and the second transistor of the transistor circuit.

The control circuit has a series circuit formed by the first control transistor, the second control transistor and the third control transistor. The input of the first control transistor is connected to the output. The input of the second control transistor is connected to the output of the delay circuit. The input of the third control transistor is connected to the output. The junction point between the second control transistor and the third control transistor is connected to the input of the second transistor of the transistor circuit.

A fourth control transistor is connected in parallel with the third control transistor. The input of the fourth control transistor is connected to the output of the delay circuit. The fourth control transistor switches off the second transistor of the transistor circuit as a function of the delay time of the delay circuit.

In addition to the pull-down transistor, the output amplifier according to the invention uses a pull-up transistor circuit, which applies a second potential to the output only when the input signal changes from a first value to a second value.

The delay means for driving the pull-up transistor circuit should be coordinated with the load capacitance of the line present at the output, in order to avoid overcharging or undercharging the output. In order to coordinate the delay exactly with the charging time of the load capacitance, it is possible to provide a control circuit in the pull-up transistor circuit, which control circuit opens the pull-up path precisely until the load capacitance is charged.

Furthermore, overload protection can be achieved by virtue of the fact that the pull-up transistor circuit is switched off in the event of an overload and overloading of the module is thus avoided.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 1 shows the GTL output amplifier with a pull-up transistor circuit,

FIG. 2 shows a variation of the output amplifier according to FIG. 1,

FIG. 3 shows the output amplifier with a control circuit within the pull-up transistor circuit, FIG. 4 shows a further output amplifier with control circuit, FIG. 5 shows the output amplifier with overload protection.

DESCRIPTION OF THE PREFERRED EMBODIMENTS

Figure 6:
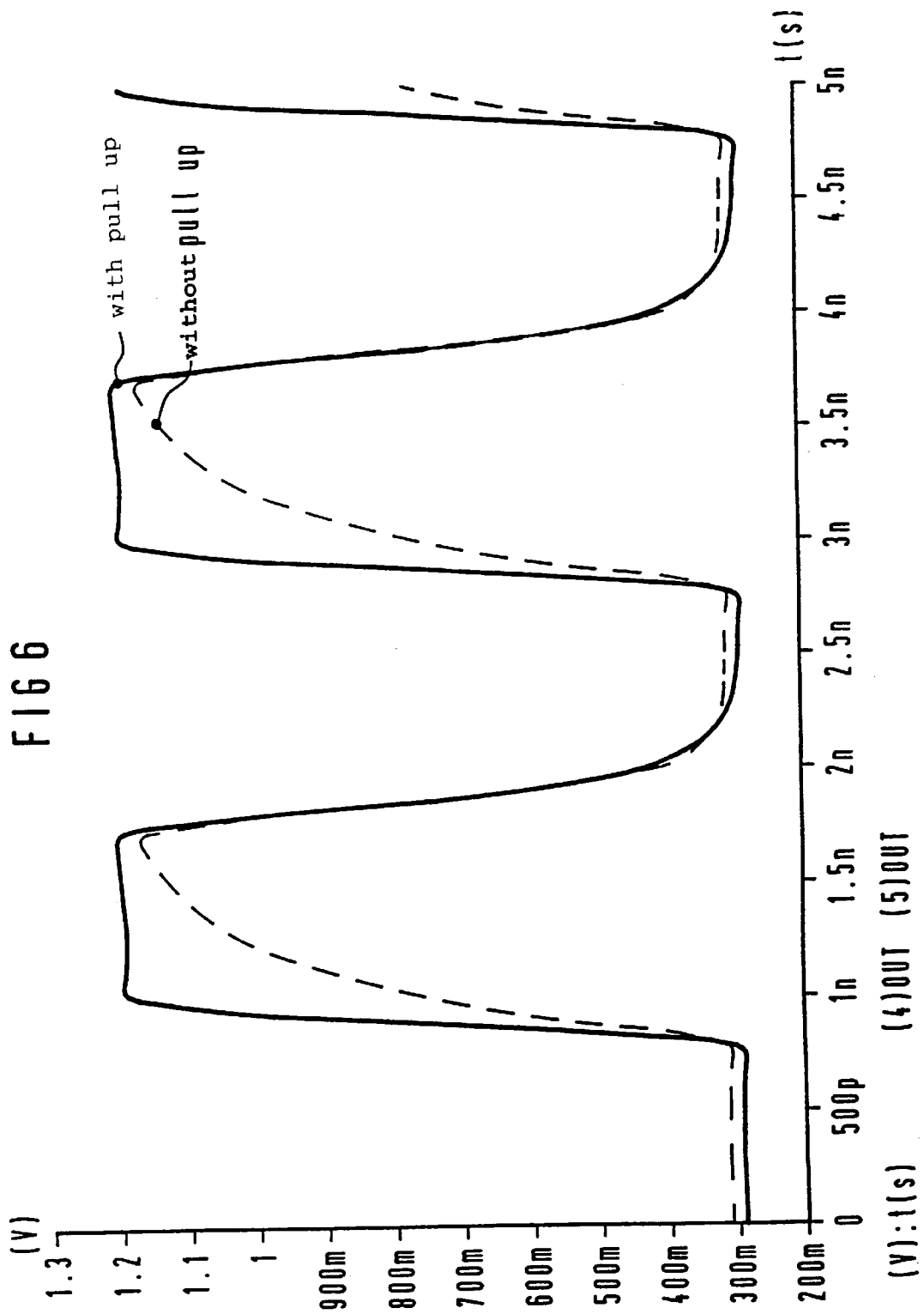
FIG. 6 shows a diagram illustrating the dependence of the output signal on the time t for the circuit of FIG. 1.

Identical components are designated by identical reference symbols in the figures below.

FIG. 1 shows a GTL output amplifier AV, to whose output A a line which is terminated by a resistor R of 50 Ω, for example, is connected. The load capacitance CL of the line is furthermore illustrated in FIG. 1. An input signal E, for example a binary signal, is fed in at the input E of the output amplifier AV. This signal may be inverted by an invertor IN. The potential at the output A is determined, on the one hand, by a pull-down transistor MN1, which puts the output A at a first potential when it is switched on. Furthermore, the output amplifier AV contains a pull-up transistor circuit, comprising the transistors MP1 and MN2 in the exemplary embodiment. If both transistors are switched on, then this pull-up transistor circuit applies a second potential to the output A. The inverted input signal e is present at the input of the transistor MP1, and is also applied to the pull-down transistor MN1. The inverted input signal e is present at the input of the transistor MN2 of the pull-up transistor circuit after having been delayed by a delay circuit VZ1. Finally, another transistor MN3 is provided, which is likewise driven by the inverted input signal e and is connected to the junction point of the series circuit formed by the transistors MP1 and MN2 of the pull-up transistor circuit.

The circuit relates to applications according to the GTL standard. The voltage levels at the output of the circuit are 1.2 volts for the logic state HIGH and 0.4 volt for the logic state LOW.

The pull-up transistor circuit MP1, MN2 is connected in such a way that it is switched on only momentarily exclusively in the transition phase of the inverted input signal e from one value to the other value, and thereby reverses the charge of the load capacitance CL. In this transition phase, the output A also switches from the first potential to the second potential. As a result, the pull-up transistor circuit ensures rapid charging of the load, while the high level is subsequently held on the line by the external resistor R. This external resistor R is designed as a 50 Ω terminating resistor for matching to the 50 Ω transmission line on the board. FIG. 1 diagrammatically shows the circuit with external load capacitance CL and 50 Ω resistor R, to which the potential $V_{TT}$ is applied.

This circuit affords the advantage that in the transition phase, the 50 Ω transmission line is terminated in terms of impedance by means of the transistors MN2 and MP1 at the output A and, consequently, excessive voltage increases due to reflections of the transmission line do not occur.

The function of the output amplifier according to FIG. 1 is explained below:

It is assumed that the logic state at the node K1, which corresponds to the inverted input signal e, is "1". The logic state at the node K2 at the output of the delay circuit VZ1 is then likewise "1".

The consequence is that the transistors MN1, MN2 and MN3 are switched on and, as a result, the output A has the state "0". Viewed from the output A, the series circuit formed by the transistors MN2 and MN3 is connected in parallel with the pull-down transistor MN1. The transistor MP1 is switched off.

During the transition of the state at the node K1 from "1" to "0", firstly only the transistors MN1 and MN3 change to the off state. On account of the delay circuit VZ1, transistor MN2 maintains the state "1", for a defined delay time τ, and continues to be switched on. At the same time, the transistor MP1 switches on, with the result that the entire pull-up path MP1, MN2 is switched on and the load capacitance CL is charged via the series circuit formed by the transistors MN2 and MP1 in parallel with the external 50 Ω resistor R. After the defined delay time τ, during which the charge of the capacitance has been reversed, the node K2 also switches from "1" to "0", as a result of which the transistor MN2 switches off and thus interrupts the pull-up path. From this point in time, only the external resistor R is now responsible for holding the output level, which now has the state "1".

If the state at the node K1 then changes again from "0" to "1", the transistors MN1 and MN3 switch on and the transistor MP1 switches off. The node A is discharged via the transistor MN1 and changes to the state "0". At the same time, the node K3 is discharged via the transistor MN3. This must take place even before the transistor MN2 switches on by virtue of the delay circuit VZ1, since otherwise interference is produced at the output A; in this case, the output A would receive a small voltage spike due to the discharge of the node K3 via the transistor MN2. After the output A has been discharged and the transistor MN2 has been switched on, the initial state is once again present; the series circuit formed by the transistors MN2 and MN3 is connected in parallel with the transistor MN1.

FIG. 6 shows a diagram of the profile of the at the output plotted against the time t. The profile of the output signal at the output A with a pull-up transistor circuit is illustrated by a solid line; for comparison with this, the profile of the potential at the output without a pull-up transistor circuit is illustrated by a dashed line. A capacitive load of 5 pF at a frequency of 500 MHz and 1 GHz has been assumed here.

FIG. 2 shows a variant of the output amplifier according to FIG. 1; in this case, the transistor MN2 is merely replaced by the transistor MP2, in other words the n-channel transistor MN2 is replaced by a p-channel transistor MP2. The delay circuit VZ2 must then be correspondingly reconfigured. The functioning of the two output amplifiers of FIG. 1, FIG. 2 is identical, however.

FIG. 3 shows the output amplifier with a control circuit RS in the pull-up transistor circuit. The rest of the circuit corresponds to the output amplifier according to FIG. 2.

With the output amplifier according to FIG. 3, the delay τ of the delay circuit VZ2 is coordinated exactly with the load capacitance CL, in order to avoid overcharging or undercharging the output A. Conversely, a circuit that is designed once just for one specific load can optimally be employed. In the following text, then, the circuit described above is augmented by the control circuit RS, which, in a wide range—independently of the load—opens the pull-up path precisely until the load capacitance CL is charged or the output A has reached the state "1".

The control circuit RS of the pull-up transistor path comprises three control transistors MN10, MP10 and MP11. In this circuit, the pull-up path is interrupted when the output A has reached the state "1" or the delay circuit VZ2 responds.

Let it be assumed that the node e has the state "1" and the node K2 has the state "0"; the transistors MN1 and MN3 are then switched on and the output A has the state "0". At the same time, the control circuit transistors MP10 and MP11 are switched on and the control transistor MN10 is switched off, as a result of which the node K11 has the state "1" and the transistor MN2 is likewise switched on. The parallel circuit formed by the transistors MN2 and MN3 in parallel with the transistor MN1 is again present. The transistor MP1 is switched off.

If the state at the node K1 changes from "1" to "0", firstly it is again the transistors MN1 and MN3 which change to the off state and the transistor MP1 switches on. On account of the delay circuit VZ2, the control transistor MP11 remains in the on state for a certain time, as a result of which the node K11 remains at "1" and the pull-up path through the transistors MN2 and MP1 is thus switched on and the load capacitance at the output A can be charged via the parallel circuit formed by the 50 Ω resistor and the pull-up path. If the voltage at the output A exceeds the threshold voltage of the control transistor M10, the transistor switches on. When the voltage at the output moves (depending on the capacitive load) toward the second potential (high), the node K11 is accordingly pulled to "0", as a result of which the pull-up path through transistor MN2 is switched off and overcharging of the output A is prevented. After the pull-up path has been switched off, the 50 Ω resistor R again undertakes to hold the output level.

FIG. 4 shows a variant of the control circuit in comparison with FIG. 3, in which the gate terminal of the control transistor MP10 is connected to the node K3. In this solution, the control transistor MP10 switches off better and thereby reduces the power loss of the entire circuit.

Should the charging of the capacitive load CL not be concluded within the time predetermined by the delay circuit VZ2, for example if $V_{TT}=0$ or owing to a short circuit at the output A, as a result of which the output remains below the threshold voltage of the control transistor MN10 and the pull-up path is not interrupted by the control circuit, then, after the predetermined time, first of all the control transistor MP11 switches off and interrupts the connection of the node K11 to the state "1". The node K11 is then discharged through the control transistor MN10 and switches the transistor MN2 off, as a result of which the pull-up path is interrupted.

FIG. 5 shows a variant of FIG. 4, in which the pull-up path is switched off in a defined manner. After the time that is predetermined by the delay time τ, the control transistor MP11 is switched off and interrupts the connection of the node K11 to "1". At the same time, the control transistor MN11 switches on and pulls the node K11 to "0". As a result, the transistor MN2 is switched off and the pull-up path is interrupted, so that a parallel-path current can no longer flow. This prevents the module from being overloaded by the pull-up path and being damaged, or from loading other modules and possibly damaging them.

The transistors illustrated in the figures are MOS transistors; the n-channel transistors are designated MN, the p-channel transistors are designated by MP and the operating potentials applied to the transistors are designated by VDD and VSS in the customary manner.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A GTL output amplifier for coupling an input signal present at an input of the amplifier into a transmission line present at an output of the amplifier, comprising:

a pull-down transistor, which applies a first potential to the output for a first value of the input signal;

a pull-up transistor circuit having a series circuit formed by a first transistor, which is switched off during occurrence of the first value of the input signal and is switched on during occurrence of a second value of the input signal;

a second transistor having an input connected to a delay circuit and which remains switched on for a delay time which is governed by the delay circuit, during a transition phase of the input signal from the first value to the second value;

the delay circuit operatively connected between the input and the second transistor, the delay circuit switching off the second transistor when the second value of the input signal occurs and after the delay time governed by the delay circuit has elapsed;

a third transistor connected between a junction point of the first and second transistors of the series circuit, the third transistor being switched on during occurrence of the first value of the input signal;

the pull-up transistor circuit being supplemented by a control circuit, which has a first control transistor, a second control transistor and a third control transistor and switches the second transistor off when the third control transistor of the control circuit is switched on as soon as a potential of the output exceeds a threshold voltage of the third control transistor.

2. The output amplifier as claimed in claim 1, wherein the control circuit comprises a series circuit formed by the first control transistor, the second control transistor and the third control transistor, wherein the second control transistor is connected to an output of the delay circuit, and a junction point between the second control transistor and the third control transistor is connected to an input of the second transistor of the transistor circuit, wherein an input of the third control transistor is connected to the output; and wherein the first control transistor is connected to a junction point between the first transistor and the second transistor of the transistor circuit.

3. The output amplifier as claimed in claim 1, wherein the control circuit comprises a series circuit formed by the first control transistor, the second control transistor and the third control transistor, wherein an input of the first control transistor is connected to the output, wherein an input of the second control transistor is connected to an output of the delay circuit, wherein an input of the third control transistor is connected to the output, and wherein a junction point between the second control transistor and the third control transistor is connected to the input of the second transistor of the transistor circuit.

4. The output amplifier as claimed in claim 2, wherein a fourth control transistor is connected in parallel with the third control transistor, and wherein an input of said fourth control transistor is connected to the output of the delay circuit, said fourth control transistor switching off the second transistor of the transistor circuit as a function of the delay time of the delay circuit.

* * * * *